United States Patent
Wu et al.

(10) Patent No.: US 8,291,370 B2
(45) Date of Patent: Oct. 16, 2012

(54) PAD LAYOUT METHOD FOR SURFACE MOUNT CIRCUIT BOARD AND SURFACE MOUNT CIRCUIT BOARD THEREOF

(75) Inventors: Chung-Yang Wu, Taipei (TW); Hung-Tao Wong, Taipei (TW)

(73) Assignee: Inventec Corporation, Taipei (TW)

( * ) Notice: Subject to any disclaimer, the term of this patent is extended or adjusted under 35 U.S.C. 154(b) by 425 days.

(21) Appl. No.: 12/689,990

(22) Filed: Jan. 19, 2010

(65) Prior Publication Data

US 2011/0178623 A1    Jul. 21, 2011

(51) Int. Cl.
*G06F 17/50* (2006.01)

(52) U.S. Cl. ........ 716/137; 716/106; 716/110; 716/111; 716/119

(58) Field of Classification Search .......... 716/106–107, 716/110–111, 119, 122, 136–137
See application file for complete search history.

(56) References Cited

U.S. PATENT DOCUMENTS

2008/0209378 A1 * 8/2008 Oggioni .......................... 716/10
* cited by examiner

*Primary Examiner* — Paul Dinh
(74) *Attorney, Agent, or Firm* — Morris Manning & Martin LLP; Tim Tingkang Xia, Esq.

(57) ABSTRACT

A pad layout method for surface mount circuit board and a surface mount circuit board are described. The layout method includes the following steps. Firstly, coefficients of thermal expansion of a circuit board and a surface mounted component are obtained, and the circuit board is supplied with a plurality of predetermined layout positions in advance. Then, an operating temperature for combining the surface mounted component with the circuit board is determined, and a room temperature is measured. A plurality of actual layout positions on the circuit board is determined according to $d=(CTEa-CTEb) \times (Ts-Tr)$, where d is an offset distance between the actual layout position and the predetermined layout position. Finally, a plurality of pads is laid out on the actual layout positions, such that the pads are formed on the circuit board.

3 Claims, 7 Drawing Sheets

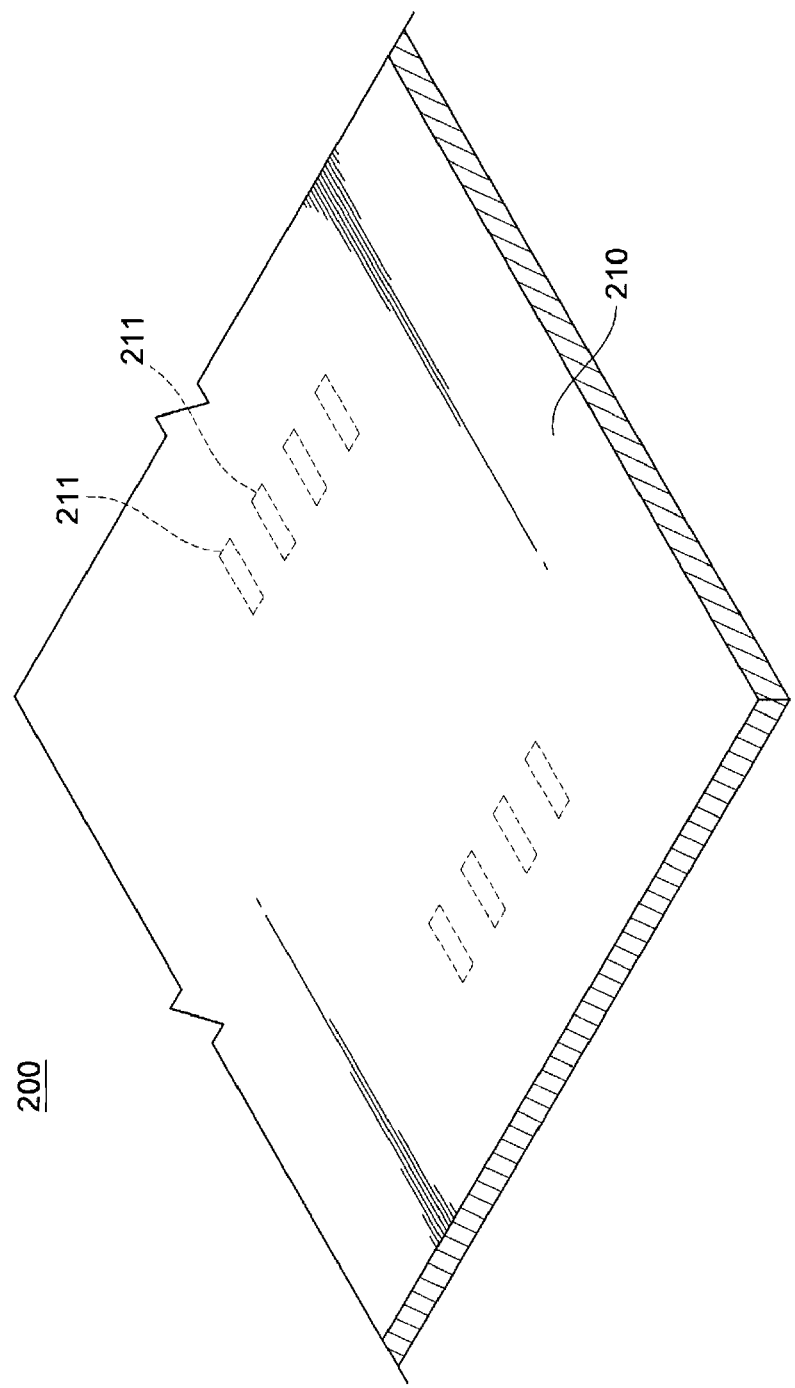

PAD LAYOUT METHOD FOR SURFACE MOUNT CIRCUIT BOARD AND SURFACE MOUNT CIRCUIT BOARD THEREOF

BACKGROUND OF THE INVENTION

1. Field of Invention

The present invention relates to a pad layout method for a circuit board and a circuit board structure thereof, more particularly to a pad layout method for a surface mount circuit board and a surface mount circuit board thereof, for preventing the surface mounted component and the circuit board from being warped or deformed.

2. Related Art

Plastic raw materials are approximately classified into thermoplastic plastics and thermosetting plastics. Recently, the plastic material commonly adopted in the electrical connector industry is the thermoplastic plastic. The thermoplastic plastic, usually in a particle form under the room temperature, is capable of being changed into a melted status after being heated to a certain temperature, injection-molded after being cooled, and softened into the melted status after being heated again, and then injection-molded again. Therefore, the thermoplastic plastic can be repeatedly injection-molded through being heated and melted.

However, usually, when a surface mount technology (SMT) process is performed on an electrical connector of an elongated shape, such as an electrical connector applied in a dual in-line memory module (DIMM) or an electrical connector applied in a single in-line memory module (SIMM), due to the elongated size, the electrical connector of the memory module may be softened after being baked on the circuit board by a fan convection or an IR-reflow soldering oven.

In order words, during the SMT process, the hot air released from the fan convection or the IR-heating device is usually above the connector of the memory module, such that an upper portion of a plastic body of the connector is affected with a higher temperature. Relatively, a lower portion of the plastic body is affected with a lower temperature. Different temperatures affected at the upper and lower portions of the plastic body may easily cause the plastic body to have a larger thermal expansion rate at the upper portion than that at the lower portion, or to have a larger thermal expansion rate at the lower portion than that at the upper portion, thereby causing a central portion of the plastic body to be arched upward or downward, and further causing the connector structure to be warped and deformed.

In such a manner, the plastic body may easily generate the phenomenon of non-uniform expansion degree due to non-uniform heating, and generate deformation on the structure (that is, the plastic body is warped into a U shape or an inversed U shape), such that the pin terminal inserted in the plastic body departs from the pad on the circuit board. In order words, the pin terminal and the pad on the circuit board that are original aligned may fail to practically contact each other or even generate a misalignment phenomenon due to the different expansion amounts of different portions of the plastic body, so that the pad cannot be accurately soldered to the pin terminal, thereby causing the problem of missing solder or insufficient solder. Moreover, the holding intensity of soldering is also insufficient, or even severer problems exist, such as a short circuit caused by soldering the pin terminal to a wrong position of the pad of the circuit board. Therefore, it is necessary to seek for a preventing method of solving such a problem of non-uniform thermal expansion rate.

SUMMARY OF THE INVENTION

In view of the aforementioned problem, the present invention is a pad layout method for a surface mount circuit board and a surface mount circuit board thereof, for preventing the plastic body of the conventional electrical connector from being warped and deformed due to non-uniform heating, thereby avoiding the problem of missing solder or insufficient solder of a pin terminal caused by a misalignment between the pin terminal of the electrical connector and the pad of the circuit board.

The present invention provides a pad layout method for a surface mount circuit board, which comprises the following steps. Firstly, a coefficient of thermal expansion $CTEa$ of a circuit board and a coefficient of thermal expansion $CTEb$ of a surface mounted component are obtained, and the circuit board is provided with a plurality of predetermined layout positions. Then, an operating temperature $Ts$ for combining the surface mounted component with the circuit board is determined, and a room temperature $Tr$ is measured. A plurality of actual layout positions on the circuit board is determined according to $d=(CTEa-CTEb)\times(Ts-Tr)$, where $d$ is an offset distance between the actual layout positions and the predetermined layout positions. Finally, a plurality of pads is laid out on the actual layout positions, such that the pads are formed on the circuit board.

The present invention provides a surface mount circuit board, which has a plurality of predetermined layout positions provided for at least one surface mounted component to be electrically disposed thereon. The circuit board in the present invention comprises a substrate and a plurality of pads. The substrate has a plurality of actual layout positions, and the pads are respectively disposed on the actual layout positions. An offset distance exists between the actual layout positions and the predetermined layout positions, and is determined according to $d=(CTEa-CTEb)\times(Ts-Tr)$, where $d$ is the offset distance between the actual layout positions and the predetermined layout positions; $CTEa$ is the coefficient of thermal expansion of the substrate; $CTEb$ is the coefficient of thermal expansion of the surface mounted component; $Ts$ is an operating temperature for combining the surface mounted component with the circuit board; and $Tr$ is the room temperature.

The efficacy of the present invention lies in that, the offset distance between the actual layout positions and the predetermined layout positions of the circuit board is calculated according to the aforementioned equation, thereby slightly changing the layout position of the pad disposed on the circuit board, effectively compensating the deformation amount generated by the difference between the coefficients of thermal expansion of the surface mounted component and the circuit board, preventing the circuit board or the surface mounted component from being warped or deformed due to non-uniform heating, further avoiding the situation of the pin terminal of the surface mounted component being stripped from the pad of the circuit board, and greatly enhancing the reliability of the process.

BRIEF DESCRIPTION OF THE DRAWINGS

The present invention will become more fully understood from the detailed description given herein below for illustration only, and thus are not limitative of the present invention, and wherein:

FIGS. 2A to 2F are schematic views of the steps of a pad layout method according to the present invention.

DETAILED DESCRIPTION OF THE INVENTION

Figure 1:
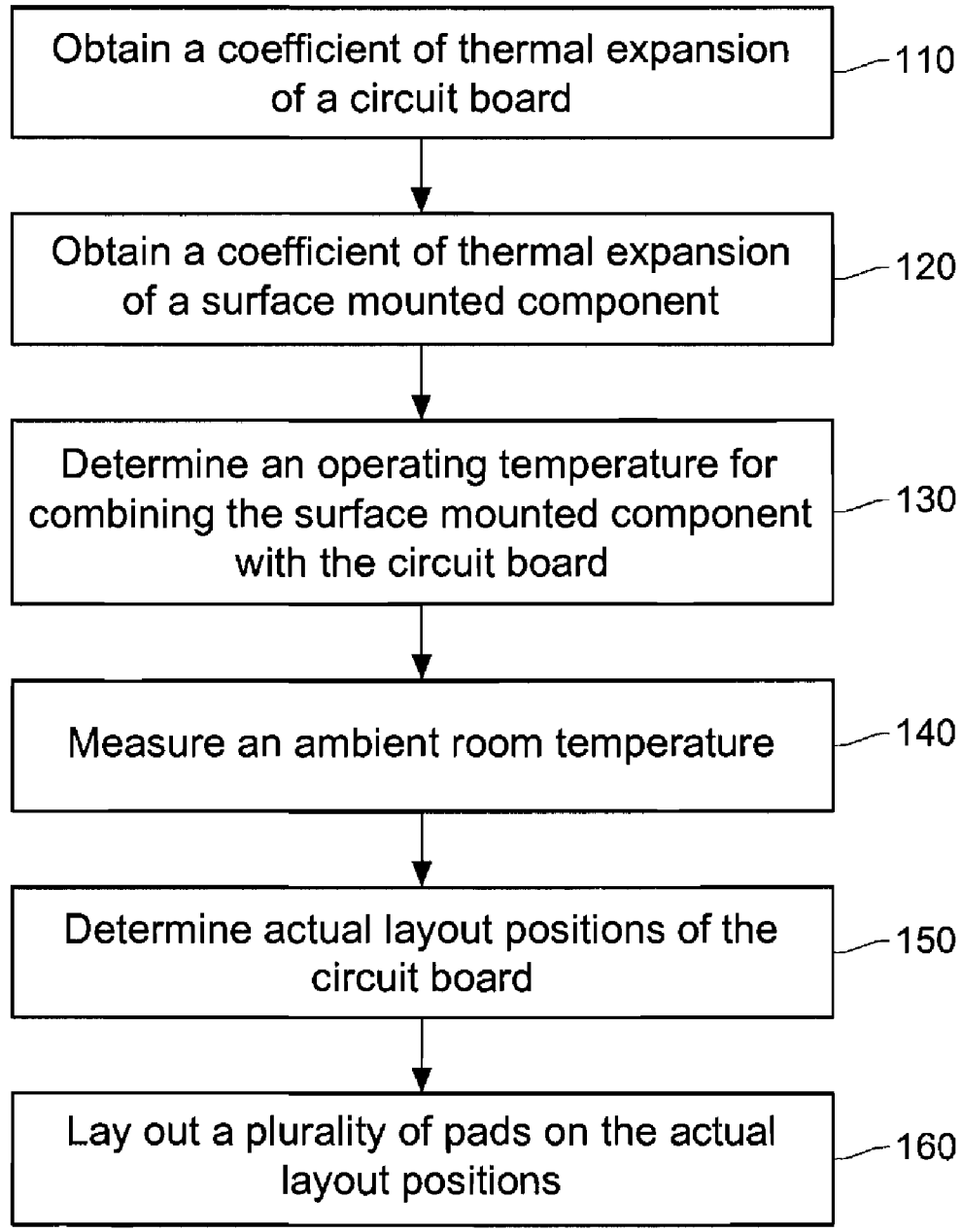
FIG. 1 is a flow chart of steps according to the present invention.

FIG. 1 is a flow chart of steps according to an embodiment of the present invention, and FIGS. 2A to 2F are schematic views of breaking up steps according to an embodiment of the present invention.

Figure 2B:
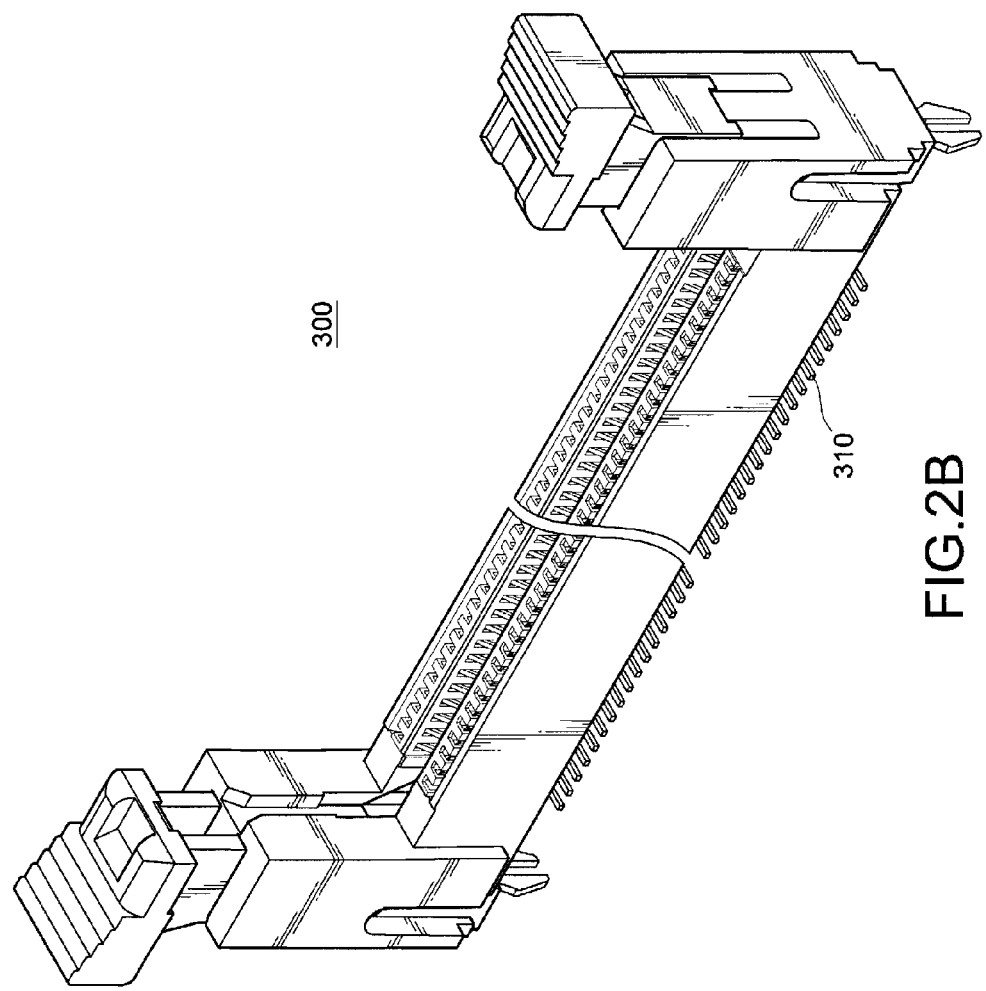

Referring to FIG. 1, together with FIGS. 2A and 2B, the pad layout method of the surface mount circuit board disclosed in the present invention comprises firstly providing a circuit board 200, obtaining a coefficient of thermal expansion CTEa of the circuit board 200 according to manufacturing materials selected for the circuit board 200 (Step 110), and designing a plurality of predetermined layout positions 211 in advance on a surface of the circuit board 200 by means of, for example, a computer program calculation method. The predetermined layout positions 211 are originally designed layout positions on the circuit board 200, and belong to settings of virtual positions. The predetermined layout positions 211 of the conventional circuit board 200 are arranged in equal intervals.

The circuit board 200 in this embodiment is a surface mount circuit substrate for the use of the subsequent surface mount technology (SMT) process. Moreover, the material of the circuit board 200 in this embodiment is an epoxy resin material (FR4) with the coefficient of thermal expansion approximately being CTEa=18.8 ppm/° C. However, the circuit board 200 of different materials may also be selected by persons skilled in the art, and is not limited to the types of the circuit board disclosed in this embodiment.

Next, a surface mounted component 300 is provided, and a coefficient of thermal expansion CTEb of the surface mounted component 300 is obtained according to the manufacturing material selected for the surface mounted component 300 (Step 120). The surface mounted component 300 has a plurality of pin terminals 310. The coefficient of thermal expansion of the surface mounted component 300 in this embodiment is approximately CTEa=12.8 ppm/° C. The surface mounted component 300 of different materials may be selected by persons skilled in the art according to the actual demand, and is not limited to this embodiment.

Then, an operating temperature Ts for combining the surface mounted component 300 with the circuit board 200 is determined according to actual process parameters of the SMT (Step 130). The operating temperature (also referred to as soldering temperature) adopted in this embodiment is about 220° C., but is not limited to such an operating temperature. Furthermore, a room temperature Tr is measured (Step 140), which indicates a temperature of an operating environment site, and is preferably 25° C.

Figure 2C:
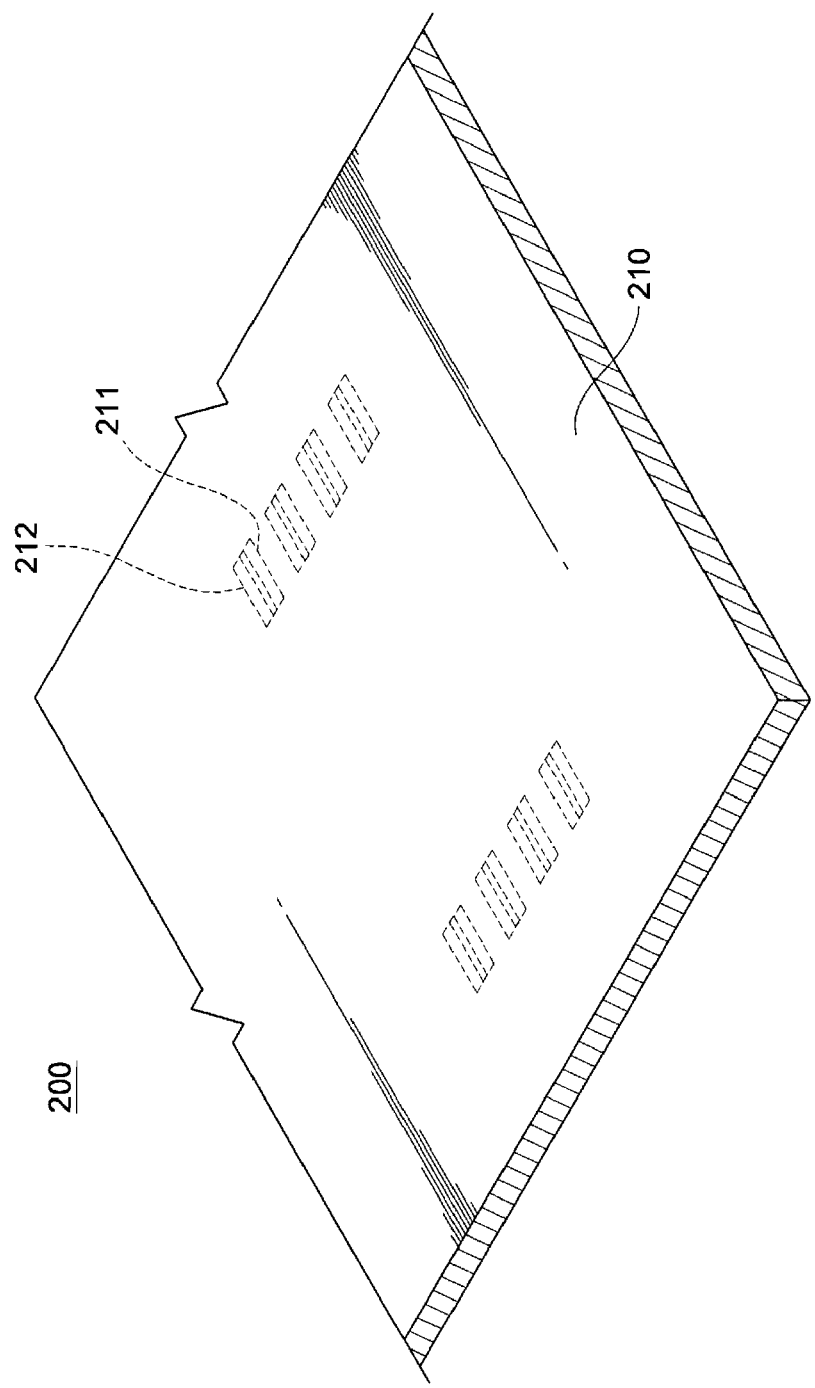

Referring to FIG. 1, together with FIG. 2C, a plurality of actual layout positions 212 of the circuit board 200 is determined according to $d=(CTEa-CTEb)\times(Ts-Tr)$ (Step 150), where d is an offset distance between the actual layout positions 212 and the predetermined layout positions 211. The SMT parameters in this embodiment are taken for specific illustrations. The SMT parameters are substituted into the aforementioned equation, i.e., (18.8 ppm/° C.–12.8 ppm/° C.)×(220° C.–25° C.), so as to obtain the offset distance between the actual layout positions 212 and the predetermined layout positions 211, i.e., d=1170 ppm=1.17 mm. Thereby, the pad layout positions of the circuit board 200 are the optimal design positions. The aforementioned parameters may differ according to the actually used material of the substrate 210, the type of the surface mounted component 300, or settings of actual reflow soldering temperature, and are not limited to this embodiment.

It should be noted that, if the obtained offset distance d between the actual layout positions 212 and the predetermined layout positions 211 is a positive value, the actual layout positions 212 offset to an outside direction of the circuit board 200; and if the obtained offset distance d between the actual layout positions 212 and the predetermined layout positions 211 is a negative value, the actual layout positions 212 offset to an inside direction of the circuit board 200.

Further, it is also an option to only adjust a part of the actual layout positions 212 to offset from the predetermined layout positions 211. The positioning of the partially offset actual layout positions 212 can be obtained by merely multiplying a result of dividing the total calculated offset distance d by a total number of pin terminals 310 (as shown in FIG. 2B) with the amount of the actual layout positions 212 to be offset.

Figure 2D:
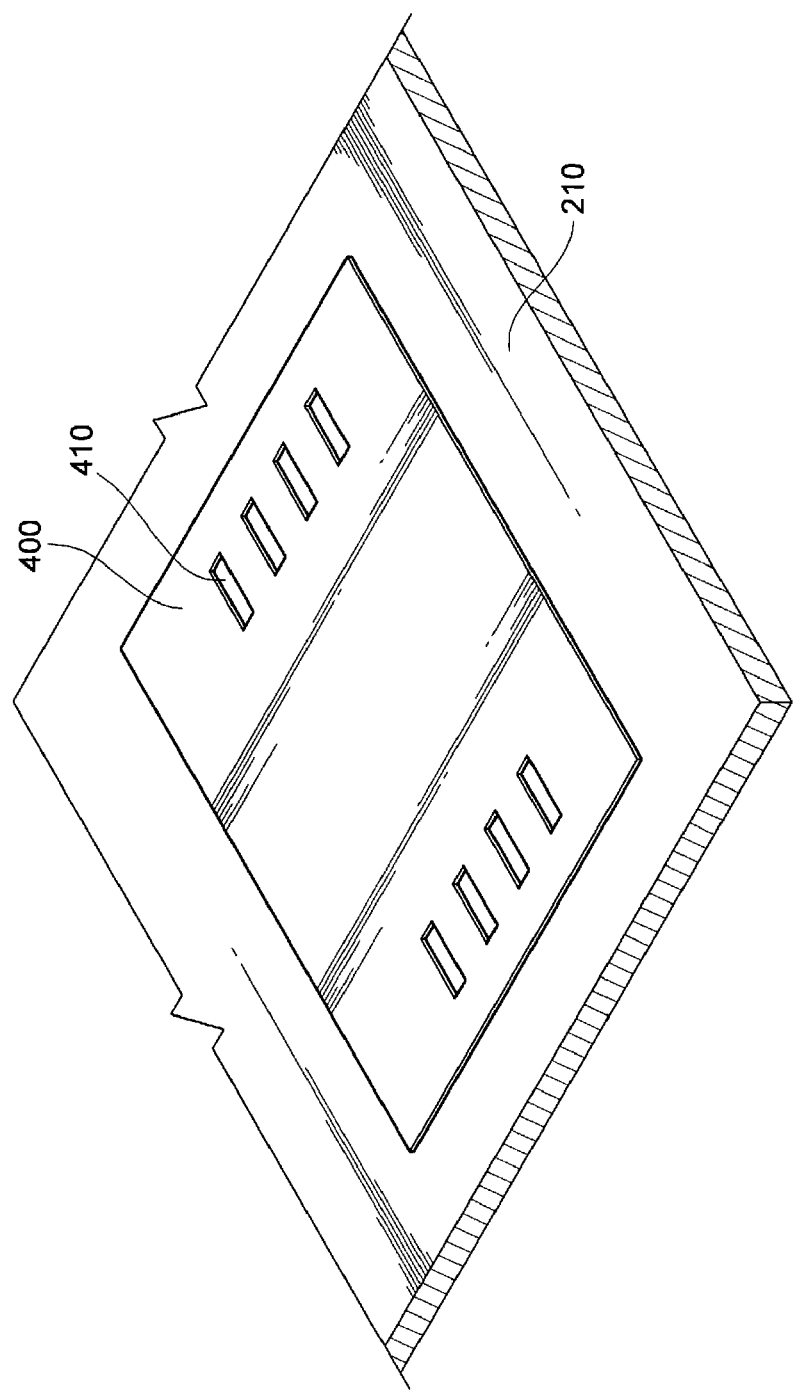
Figure 2E:
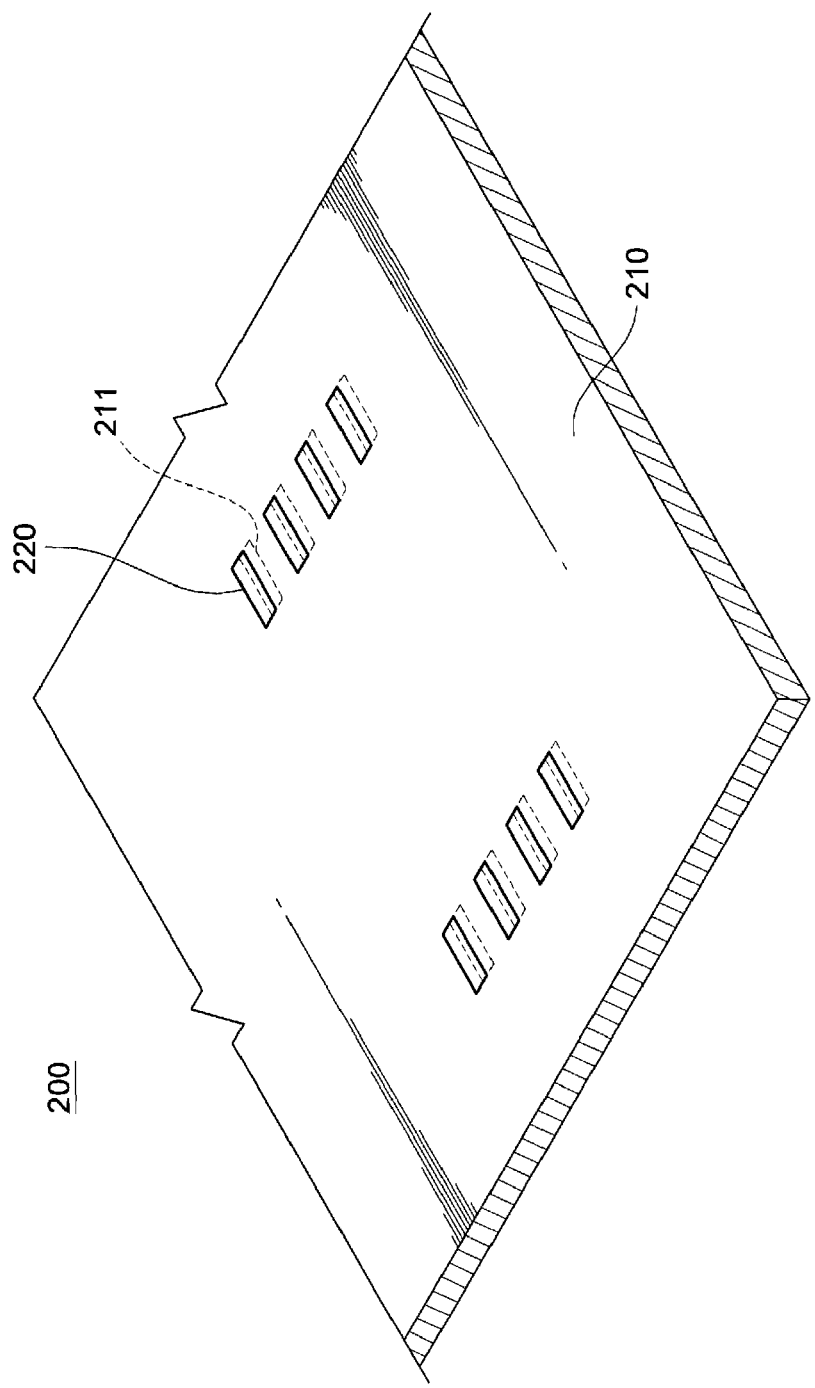

Referring to FIG. 1, together with FIGS. 2D and 2E, a plurality of pads 220 is laid out on the actual layout positions (Step 160), such that the pads 220 are formed on a surface of the substrate 210, and the distance between the pads 220 and the predetermined layout positions 211 is the aforementioned calculated offset distance d. However, the position of the pad 220 is still within the size range of each pin terminal 310 of the surface mounted component 300 as shown in FIG. 2B.

The process step of laying out a plurality of pads 220 in this embodiment is realized by forming the pads 220 on the substrate 210 through a printing steel plate 400 having a plurality of openings 410 in a manner of screen printing, so as to form the circuit board 200. The positions of arranging the plurality of openings 410 of the printing steel plate 400 are determined according to the actual layout positions 212, such that the pads 220 can be accurately formed on the actual layout positions 212.

Figure 2F:
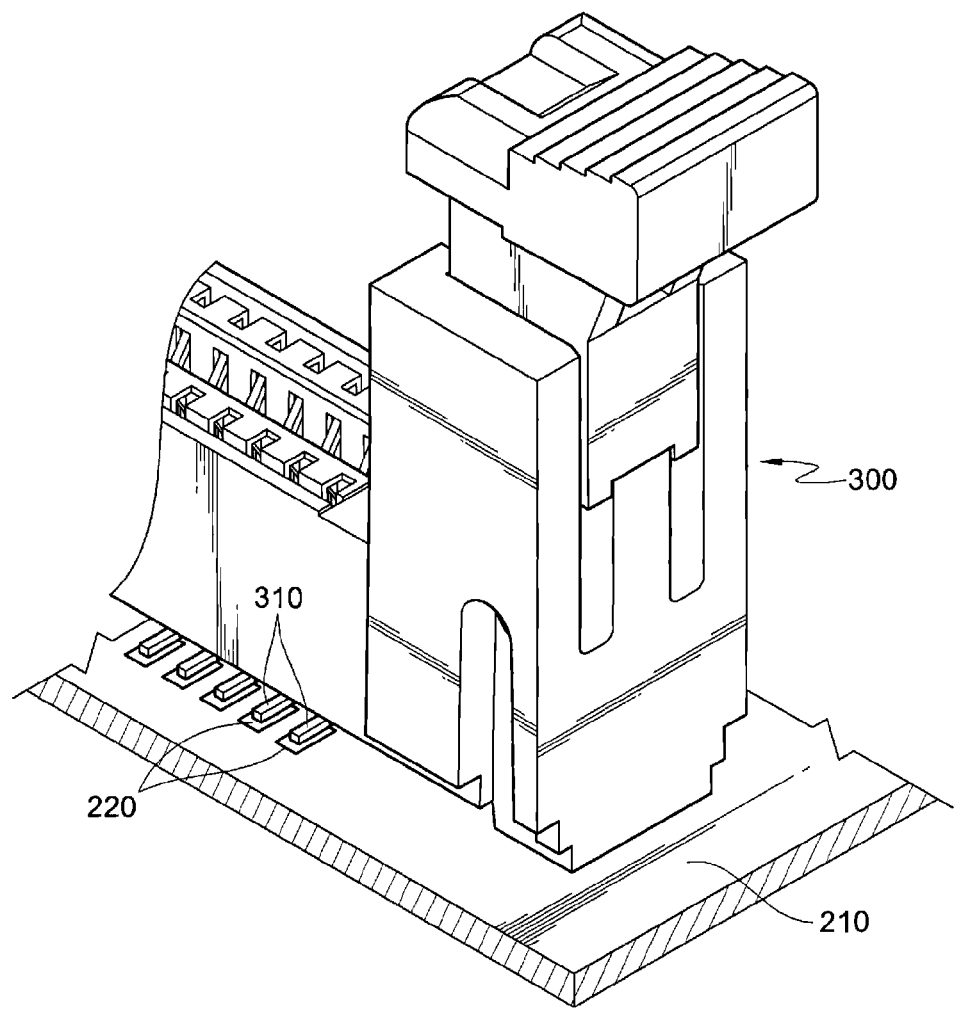

With reference to FIG. 2F, finally, the surface mounted component 300 is fixed on the substrate 210 by means of the SMT, and each pin terminal 310 of the surface mounted component 300 is respectively mounted on the pads 220, such that the surface mounted component 300 and the circuit board 200 are electrically connected.

The pad layout method of the surface mount circuit board and the surface mount circuit board disclosed in the present invention can calculate the actual layout positions of the pads disposed on the circuit board according to the aforementioned equation, i.e., $d=(CTEa-CTEb)\times(Ts-Tr)$, effectively compensate for the deformation amount caused by the difference between the coefficients of thermal expansion of the surface mounted component and the circuit board, thereby preventing the circuit board or the surface mounted component from being warped and deformed due to non-uniform heating, further avoiding the situation of the pin terminal of the surface mounted component being stripped from the pads of the circuit board, and greatly enhancing the reliability of the reflow soldering process performed on the surface mounted component.

What is claimed is:

1. A surface mount circuit board, having a plurality of predetermined layout positions provided for at least one surface mounted component to be electrically disposed thereon, the circuit board comprising:

a substrate, having a plurality of actual layout positions; and a plurality of pads, respectively disposed on the actual layout positions, wherein an offset distance exists between the actual layout positions and the predetermined layout positions, and the offset distance is determined according to a following equation:

$$d=(CTEa-CTEb)\times(Ts-Tr)$$

where, d is the offset distance between the actual layout positions and the predetermined layout positions; CTEa is a coefficient of thermal expansion of the substrate; CTEb is a coefficient of thermal expansion of the surface mounted component; Ts is an operating temperature for combining the surface mounted component with the circuit board; and Tr is a room temperature.

2. The surface mount circuit board according to claim 1, wherein the pads are formed on the substrate through a printing steel plate in a manner of screen printing.

3. The surface mount circuit board according to claim 2, wherein the printing steel plate has a plurality of openings arranged at positions corresponding to the actual layout positions respectively.

* * * * *